United States Patent

Kurihara

[11] Patent Number: 5,964,894
[45] Date of Patent: Oct. 12, 1999

[54] IC TEST EQUIPMENT, MEASUREMENT METHOD IN THE IC TEST EQUIPMENT, AND STORAGE MEDIUM OF THE SAME

[75] Inventor: Kouichirou Kurihara, Tokyo, Japan

[73] Assignee: Ando Electric Co., Ltd., Tokyo, Japan

[21] Appl. No.: 09/141,991

[22] Filed: Aug. 28, 1998

[30] Foreign Application Priority Data

Aug. 29, 1997 [JP] Japan ..................................... 9-234549

[51] Int. Cl.$^6$ .................................................. G01R 31/28
[52] U.S. Cl. ............................................ 714/738; 714/744
[58] Field of Search ..................................... 714/738, 742, 714/744, 735, 736, 733, 734, 718, 719; 365/201

[56] References Cited

U.S. PATENT DOCUMENTS

| | | | |
|---|---|---|---|
| 4,928,278 | 5/1990 | Otsuji et al. | 371/25.1 X |
| 5,646,948 | 7/1997 | Kobayashi et al. | 371/21.2 |
| 5,682,390 | 10/1997 | Housako et al. | 371/21.3 |

Primary Examiner—Hoa T. Nguyen
Attorney, Agent, or Firm—Flynn, Thiel, Boutell & Tanis, P.C.

[57] ABSTRACT

An IC test equipment corrects the timing data for generating the strobe signal by each of the paths corresponding to a plurality of the devices under test measured in parallel and achieves an accurate measurement by each path, a measurement method in the IC test equipment, and a storage medium of the same. The IC test equipment is constructed as follows. The data generating circuit outputs the minimum value T1min of the timing data to the adding circuit. The data correction circuit outputs to the adding circuit the delay time TDLn with regard to the foregoing T1min corresponding to the device under test of the concerned number in accordance with the number data Dn inputted from the controller of the device under test. The adding circuit adds the foregoing T1min and the delay time TDLn to correct the timing data. Further, the clock generator generates the strobe signal on the basis of the corrected timing data inputted from the adding circuit to output to the register, and controls to latch inside the register circuit the voltage level data inputted to the register circuit from the judgment circuit when the strobe signal is generated.

15 Claims, 2 Drawing Sheets

IC TEST EQUIPMENT, MEASUREMENT METHOD IN THE IC TEST EQUIPMENT, AND STORAGE MEDIUM OF THE SAME

BACKGROUND OF THE INVENTION

1. Field of the Invention

The present invention relates to an IC test equipment to test semiconductor integrated circuits, specifically to an IC test equipment that has a common judgment circuit and measures a plurality of devices under test in parallel, a measurement method in the IC test equipment, and a storage medium of the same.

2. Description of the Related Art

In recent years, circuits used in various electronic equipments have been made into ICs (Integrated Circuits) with impetus. IC or LSI (Large Scale Integrated circuit) is embodied by printing, vapor deposition, and other methods, by which the functions of resistors, capacitors, transistors, and other devices are formed. However, there are some dispersions in characteristics among these products which are mass-produced. The IC test equipment is to test whether the characteristic of the IC or LSI with such dispersions meets the specification or not.

When semiconductor integrated circuits such as an IC are tested using an IC test equipment, it is effective that a plurality of devices under test (Device Under Test: DUT) are tested in parallel by one and the same device program.

A conventional IC test equipment 11 will now be described with reference to FIG. 2, by which a plurality of devices under test can be tested in parallel.

FIG. 2 is a block diagram to illustrate the circuit configuration of the conventional IC test equipment 11, in which devices under test (1) through (5) are mounted on an IC measurement board 30.

In FIG. 2, the IC test equipment 11 comprises a pattern generator 12, controller 13, clock generator 14, judgment circuit 15, register circuit 16, data generating circuit 17, and clock generator 20, and tests a plurality of devices under test (1) through (5) mounted on the IC measurement board 30.

First, the controller 13 outputs to the clock generator 14 a control signal that indicates the very device under test a plurality of the foregoing devices under test (1) through (5), and controls the clock generator 14 to output the Enable signal to arbitrary device to be tested. The clock generator 14 generates the Enable signal for bringing the devices under test into the Enable state, and supplies the Enable signal only to the arbitrary device to be tested out of a plurality of the devices under test on the basis of the control signal inputted from the controller 13.

Next, the pattern generator 12 generates a pattern signal required for testing the devices under test, and outputs the pattern signal to each of the foregoing devices under test (1) through (5). On the other hand, the data generating circuit 17 outputs to the clock generator 20 a timing data T1 for the clock signal (strobe signal to define the time-position when good or not good is judged) generated by the clock generator 20.

And, the judgment circuit 15 judges the voltage level of a signal when an output terminal of a plurality of the foregoing devices under test is short-circuited, and transfers the result to the register circuit 16. In practice, the clock generator 14 controlled by the controller 13 selects one arbitrary device under test out of a plurality of the devices under test, and brings only the selected device under test into the Enable state. And, the judgment circuit 15 judges the voltage level of the signal outputted from the output terminal of the selected device under test, and transfers it as a voltage level data to the register circuit 16.

And, the clock generator 20 generates the strobe signal on the basis of the timing data T1 inputted from the data generating circuit 17 to output to the register circuit 16, and controls to latch inside the register circuit 16 the voltage level data inputted to the register circuit 16 from the judgment circuit 15 when the strobe signal is generated. The register circuit 16 latches to hold inside thereof the voltage level data inputted from the judgment circuit 15, on the basis of the timing of the strobe signal inputted from the clock generator 20.

However, in the foregoing IC test equipment 11, the time from when the pattern signal is outputted from the pattern generator 12 until when the pattern signal propagates through a device under test, passes through the judgment circuit 15, and reaches the register circuit 16 differs depending on the path corresponding to the device under test that the pattern signal propagates through. T1n is the time from when the pattern signal is outputted until when the pattern signal propagating through the n-th device under test (n: anyone of the numbers (1) through (5) of the devices under test) reaches the register circuit 16. T11, T12, . . , T15 are the times, based on the above definition, when the pattern signal passes through the devices under test (1), (2), . . . , (5), respectively, which have different values each other. T1 is defined as the average value of the times T11, T12, . . , T15.

Naturally, the T1 as the average of the times T11, T12, . . , T15 is deviated from the times T11, T12, . . , T15 by each of the paths. The clock generator 20 generates the strobe signal on the basis of the timing data T1 that contains the above deviations or errors from the times T11, T12, . . , T15 by each of the paths corresponding to a plurality of the devices under test. Therefore, it is unavoidable that the voltage level data inputted from the judgment circuit 15, which is latched by the register circuit 16 and held inside thereof on the basis of the timing of the strobe signal, involves measurement deviations between the devices under test.

SUMMARY OF THE INVENTION

The present invention has been made in view of the foregoing problems, and an object of the invention is to provide an IC test equipment that corrects the timing data for generating the strobe signal by each of the paths corresponding to a plurality of the devices under test measured in parallel and achieves an accurate measurement by each path, a measurement method in the IC test equipment, and a storage medium of the same.

According to the invention, the IC test equipment 1 is able to store the measurement data in the storage means on the basis of the timing data corrected by the correction data by each of the paths corresponding to a plurality of the devices under test; and therefore, the IC test equipment 1 is able to perform an accurate test of the devices without generating measurement deviations resulting from the fact that the timing data contain deviations by each of the paths corresponding to the devices under test.

According to the storage medium of the invention, a computer that executes the programs stored in the storage medium: generates a test signal for testing a device under test and outputs the test signal to each of a plurality of devices under test; selects an arbitrary device under test out of a plurality of the devices under test and controls to put the selected device under test into a state that a measurement is ready to be started; selects a correction data corresponding to the selected device under test out of the correction data by each of a plurality of the devices under test, which are stored in a correction data storage means; converts a measurement signal that the selected device under test outputs after performing a specific operation by the test signal into a measurement data that a storage means can store; and corrects a timing data to indicate a timing at which the measurement data is inputted to the storage means on the basis of the selected correction data, and instructs a timing at which the storage means stores an optimum measurement data representing a test result of the selected device under test.

Therefore, it is possible to control a computer to store the measurement data in the storage means on the basis of the timing data corrected by the correction data by each of the paths corresponding to a plurality of the devices under test; and therefore, the computer is able to perform an accurate test of the devices without generating measurement deviations resulting from the fact that the timing data contain deviations by each of the paths corresponding to the devices under test.

According to the invention, the IC test equipment 1 executes the correction of the foregoing timing data by adding the timing data and the correction data; and therefore, a simple arithmetic operation enables the IC test equipment 1 to perform an accurate test of the devices without generating measurement deviations resulting from the fact that the timing data contain deviations by each of the paths corresponding to the devices under test.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

The IC test equipment 1 according to one embodiment of the invention will hereafter be described in detail with reference to FIG. 1.

First, the configuration of the IC test equipment 1 will be described.

Figure 1:
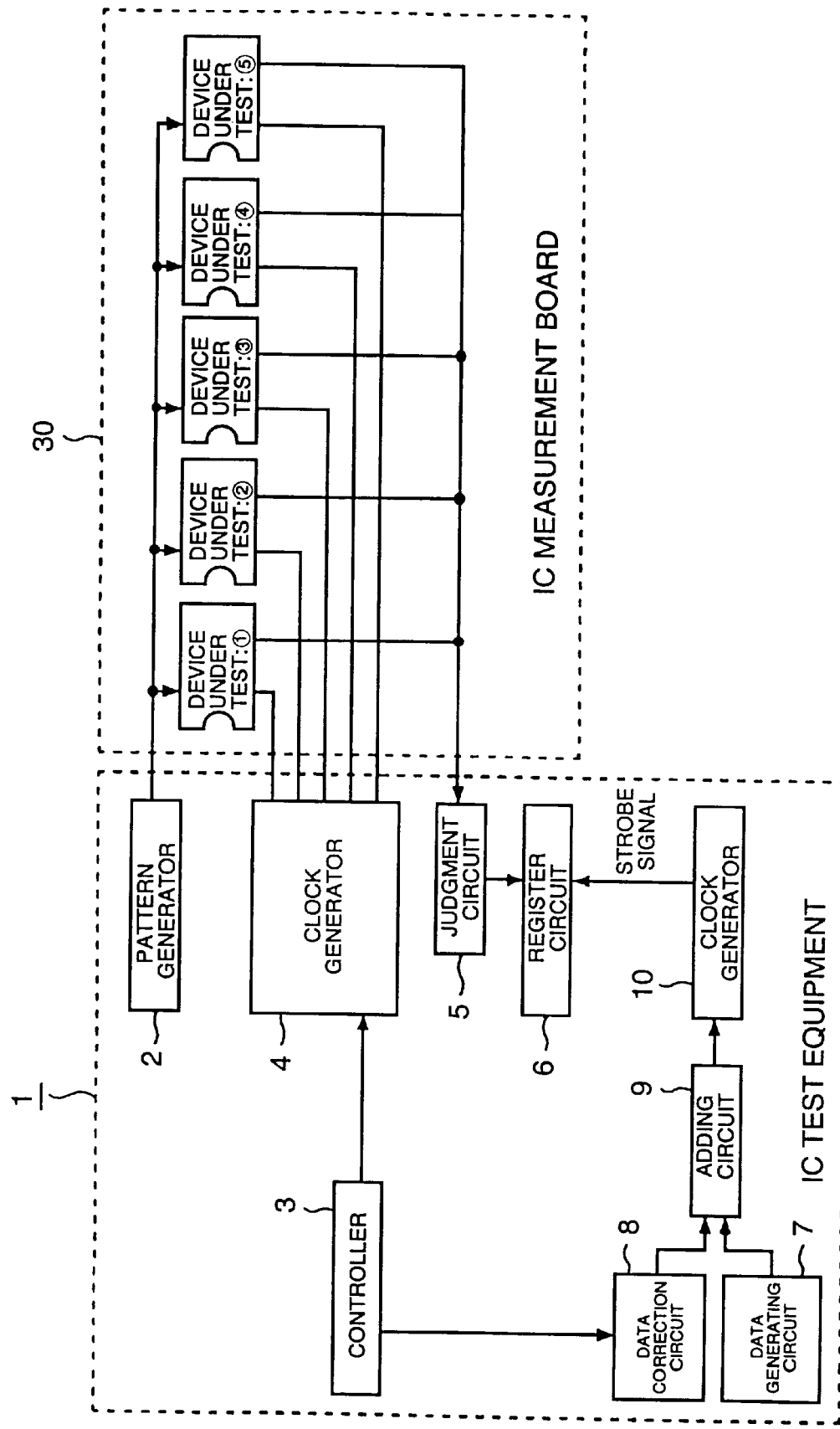
FIG. 1 is a block diagram to illustrate the circuit configuration of an IC test equipment 1 according to one embodiment of the invention.
Figure 2:
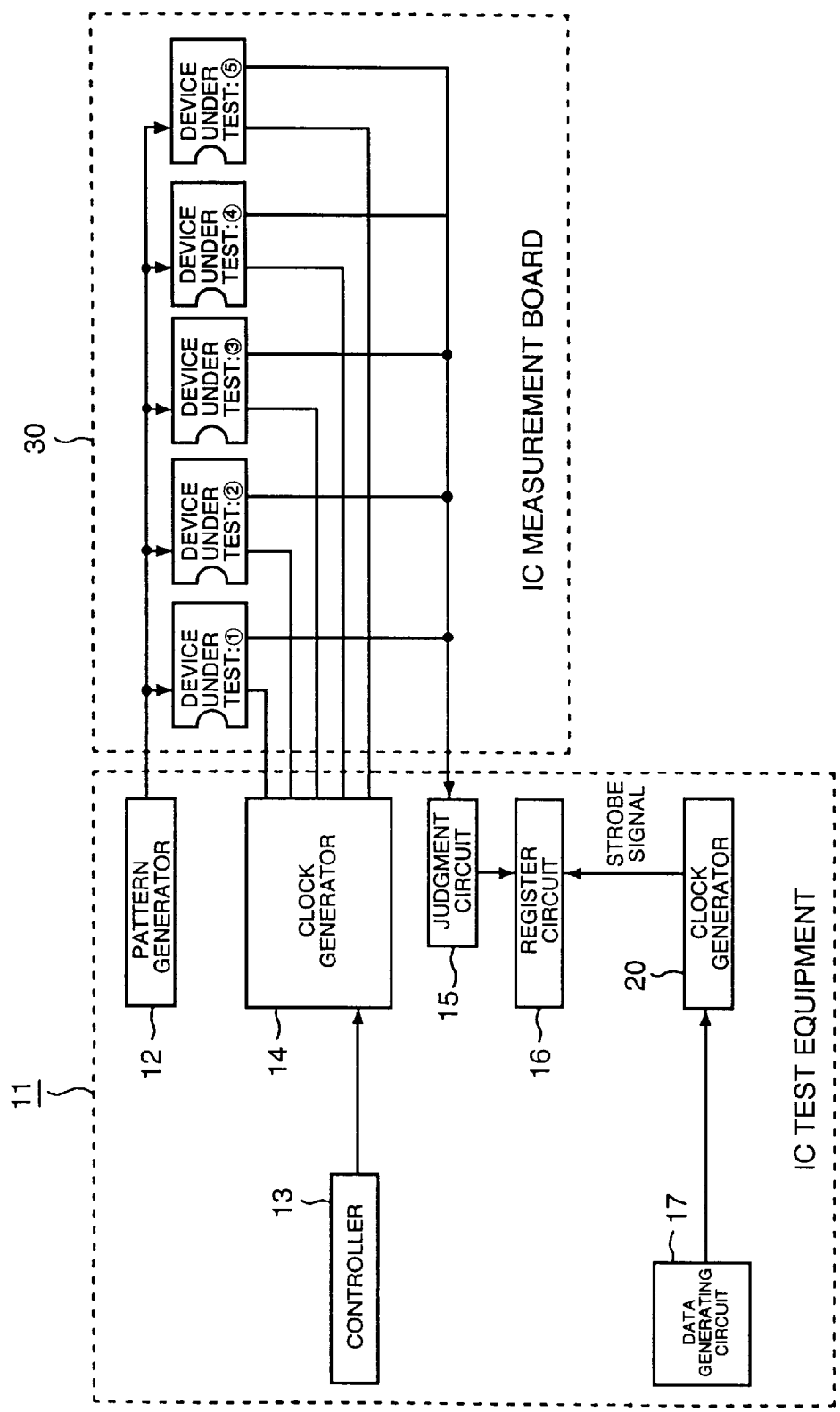
FIG. 2 is a block diagram to illustrate the circuit configuration of a conventional IC test equipment 11.

FIG. 1 is a block diagram to illustrate the circuit configuration of the IC test equipment 1 according to this embodiment, in which the devices under test (1) through (5) are mounted on the IC measurement board 30 in the same manner as in the conventional IC test equipment 11 as shown in FIG. 2.

In FIG. 1, the IC test equipment 1 comprises a pattern generator 2, controller 3, clock generator 4, judgment circuit 5, register circuit 6, data generating circuit 7, data correction circuit 8, adding circuit 9, and clock generator 10, and tests a plurality of devices under test (1) through (5) mounted on the IC measurement board 30.

The pattern generator 2 generates timing edges to specify the timings by which various waveforms are generated, synthesizes a timing edge generated and a waveform data, forms a pattern signal required for testing the devices under test, and outputs the pattern signal to each of a plurality of the devices under test (1) through (5).

The controller 3 outputs to the clock generator 4 a control signal that indicates the very device about to be tested out of a plurality of the foregoing devices under test (1) through (5), and controls the clock generator 4 to output the Enable signal to arbitrary devices to be tested. And, the controller 3 outputs the number data Dn (n: anyone of the numbers (1) through (5) of the devices under test) of the device being tested to the data correction circuit 8, and controls the data correction circuit 8 to transfer the correction data of the device being tested to the adding circuit 9.

The clock generator 4 generates the Enable signal for bringing the devices under test into the Enable state, and supplies the Enable signal only to the arbitrary devices to be tested out of a plurality of the devices under test on the basis of the control signal inputted from the controller 3.

The judgment circuit 5 judges the voltage level of a signal when an output terminal of a plurality of the foregoing devices under test is short-circuited, and transfers the result to the register circuit 6. In practice, the clock generator 4 controlled by the controller 3 selects one arbitrary device under test out of a plurality of the devices under test, and brings only the selected device under test into the Enable state. And, the judgment circuit 5 judges the voltage level of the signal outputted from the output terminal of the selected device under test, and transfers it as a voltage level data to the register circuit 6.

The register circuit 6 latches to hold inside thereof the voltage level data inputted from the judgment circuit 5 on the basis of the timing of the strobe signal inputted from the clock generator 10.

The data generating circuit 7 outputs the minimum value T1min of the timing data for the clock signal generated by the clock generator 10 to the adding circuit 9. The T1min is the minimum value of the T1n, namely, the time from when the pattern signal is outputted from the pattern generator 2 until when the pattern signal propagates through the n-th device under test (n: anyone of the numbers (1) through (5) of the devices under test), passes through the judgment circuit 5, and reaches the register circuit 6. This T1min is corrected by the correction data stored in the data correction circuit 8.

The data correction circuit 8 stores the delay time TDLn (n: anyone of the numbers (1) through (5) of the devices under test) of the foregoing T1n against the foregoing T1min as a correction data so as to put the TDLn in correspondence with each of the paths of a plurality of the devices under test. And, in response to the number data Dn inputted from the controller 3 of the device under test being tested, the data correction circuit 8 outputs the correction data TDLn corresponding to the device under test of the concerned number to the adding circuit 9.

The adding circuit 9 adds the minimum value T1min of the timing data inputted from the data generator 7 and the correction data TDLn inputted from the data correction circuit 8 to correct the timing data, and outputs the result to the clock generator 10.

The dock generator 10 generates the strobe signal on the basis of the corrected timing data inputted from the foregoing adding circuit 9 to output to the register 6, and controls to latch inside the register circuit 6 the voltage level data inputted to the register circuit 6 from the judgment circuit 5 when the strobe signal is generated. The clock generator 10 is able to generate the strobe signal on the basis of the timing data corrected by each of the paths corresponding to a plurality of the devices under test; and therefore, it is possible to perform the test of the devices without generating measurement deviations between the devices under test.

Next, the operation of the IC test equipment 1 will be described.

As an example, the operation in which the device under test (1) is tested will be described.

First, when a plurality of the foregoing devices under test are tested, the minimum value T1min of the timing data corresponding to the concerned device under test is stored in the data generator 7; and, the correction data TDLn (n: anyone of the numbers (1) through (5) of the devices under test) by each of the paths corresponding to a plurality of the foregoing devices under test is stored in the data correction circuit 8.

When the IC test equipment 1 starts the test, the controller 3 outputs to the clock generator 4 the control signal to indicate that the very device to be tested out of a plurality of the devices under test (1) through (5) is the device under test (1), and controls the clock generator 4 to output the Enable signal to the device under test (1). In response to the control signal inputted from the foregoing controller 3, the clock generator 4 generates the Enable signal for bringing the devices under test into the Enable state, and supplies the Enable signal only to the device under test (1).

And, the controller 3 outputs the number data D1 of the device under test (1) to the data correction circuit 8, and controls the data correction circuit 8 to transfer the correction data of the device under test (1) to the adding circuit 9. The data correction circuit 8 outputs the delay time TDL1 of the foregoing T11 against the foregoing T1min as a correction data to the adding circuit 9, in accordance with the number data D1 inputted from the foregoing controller 3.

And, the data generating circuit 7 outputs to the adding circuit 9 the minimum value T1min of the timing data for the clock signal that the clock generator 10 generates. The adding circuit 9 adds the minimum value T1min of the timing data inputted from the foregoing data generating circuit 7 and the correction data TDL1 inputted from the foregoing data correction circuit 8, corrects the timing data, and outputs the result to the clock generator 10.

Next, the pattern generator 2 generates the pattern signal required for testing the devices under test, and outputs the pattern signal to each of the devices under test (1) through (5). However, since the foregoing clock generator 4 supplies the Enable signal only to the device under test (1), the pattern signal passes through the device under test (1) and comes in to the judgment circuit 5.

The judgment circuit 5 judges the voltage level of a signal outputted from the output terminal of the device under test (1), and transfers the result as a voltage level data to the register circuit 6.

And, the clock generator 10 generates the strobe signal on the basis of the foregoing corrected timing data inputted from the adding circuit 9 and outputs it to the register circuit 6. Further, the clock generator 10 controls to latch inside the register circuit 6 the voltage level data inputted to the register circuit 6 from the judgment circuit 5 when the strobe signal is generated. The register circuit 6 latches to hold inside thereof the voltage level data inputted from the judgment circuit 5 on the basis of the timing of the strobe signal inputted from the clock generator 10.

The clock generator 10 is able to generate the strobe signal on the basis of the timing data corrected so as to be suitable for the path of the device under test (1); and therefore, it is possible to perform the test of the device under test (1) without generating measurement deviations.

As described hereinabove, according to the IC test equipment 1 of this embodiment, the data generating circuit 7 outputs to the adding circuit 9 the minimum value T1min of the timing data for the clock signal that the clock generator 10 generates; and the data correction circuit 8 stores the delay time TDLn of the foregoing T1n against the foregoing T1min as a correction data so as to put the TDLn in correspondence with each of the paths of a plurality of the devices under test, and outputs the foregoing delay time TDLn corresponding to the device under test of the concerned number to the adding circuit 9 in response to the number data Dn inputted from the controller 3 of the device under test being tested.

And, the adding circuit 9 adds the minimum value T1min of the timing data inputted from the foregoing data generator 7 and the correction data TDLn inputted from the foregoing data correction circuit 8 to correct the timing data, and outputs the result to the dock generator 10; and the clock generator 10 generates the strobe signal on the basis of the corrected timing data inputted from the foregoing adding circuit 9 to output to the register 6, and controls to latch inside the register circuit 6 the voltage level data inputted to the register circuit 6 from the judgment circuit 5 when the strobe signal is generated.

Therefore, the clock generator 10 is able to generate the strobe signal on the basis of the timing data corrected by each of the paths corresponding to a plurality of the devices under test; and therefore, the IC test equipment 1 is able to perform an accurate test of the devices without generating measurement deviations between the paths corresponding to the devices under test.

According to the invention, the IC test equipment 1 is able to store the measurement data in the storage means on the basis of the timing data corrected by the correction data by each of the paths corresponding to a plurality of the devices under test; and therefore, the IC test equipment 1 is able to perform an accurate test of the devices without generating measurement deviations resulting from the fact that the timing data contain deviations by each of the paths corresponding to the devices under test.

In addition, the IC test equipment 1 executes the correction of the foregoing timing data by adding the timing data and the correction data; and therefore, a simple arithmetic operation enables the IC test equipment 1 to perform an accurate test of the devices without generating measurement deviations resulting from the fact that the timing data contain deviations by each of the paths corresponding to the devices under test.

According to the invention, it is possible to control a computer to store the measurement data in the storage means on the basis of the timing data corrected by the correction data by each of the paths corresponding to a plurality of the devices under test; and therefore, the computer is able to perform an accurate test of the devices without generating measurement deviations resulting from the fact that the timing data contain deviations by each of the paths corresponding to the devices under test.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An IC test equipment to test a plurality of devices under test in parallel, comprising:

a test signal generating means that generates a test signal for testing a device under test and outputs the test signal to each of a plurality of devices under test;

a selection means that selects an arbitrary device under test out of a plurality of the devices under test and controls to put the selected device under test into a state that a measurement is ready to be started;

a conversion means to convert a measurement signal that the device under test selected by the selection means outputs after performing a specific operation by the test signal inputted from the test signal generating means into a measurement data that a storage means can store;

a storage means that stores the measurement data inputted from the conversion means;

an instruction means that stores a timing data to indicate a timing at which the measurement data is inputted from the conversion means to the storage means, and on the basis of the timing data, instructs a timing at which the storage means stores an optimum measurement data representing a test result of the device under test selected by the selection means; and a correction data storage means that stores correction data for correcting the timing data by each of a plurality of the devices under test, and the IC test equipment wherein:

the selection means selects a correction data corresponding to the selected device under test out of the correction data by each of a plurality of the devices under test, which are stored in the correction data storage means, and outputs the selected correction data to the instruction means; and the instruction means corrects the timing data on the basis of the correction data inputted from the selection means, and instructs a timing at which the storage means stores the measurement data.

2. An IC test equipment as claimed in claim 1, wherein the correction data is a data to indicate a difference in transmission time from the timing data, and the instruction means comprises an adder that adds the timing data and the correction data to correct the timing data.

3. A measurement method in an IC test equipment comprising the steps of:

generating a test signal for testing a device under test and outputting the test signal to each of a plurality of devices under test;

selecting an arbitrary device under test out of a plurality of the devices under test and controlling to put the selected device under test into a state that a measurement is ready to be started;

converting a measurement signal that the selected device under test outputs after performing a specific operation by the test signal into a measurement data that a storage means can store;

instructing a timing at which the storage means stores an optimum measurement data representing a test result of the selected device under test, on the basis of a timing data to indicate a timing at which the measurement data is inputted to the storage means;

storing correction data for correcting the timing data by each of a plurality of the devices under test in a correction data storage means;

selecting a correction data corresponding to the selected device under test out of the correction data by each of a plurality of the devices under test, which are stored in the correction data storage means; and correcting the timing data on the basis of the correction data and instructing a timing at which the storage means stores the measurement data.

4. A measurement method in an IC test equipment as claimed in claim 3, wherein the correction data is a data to indicate a difference from the timing data, and the measurement method adds the timing data and the correction data to correct the timing data.

5. A storage medium containing a program that a computer can execute, the storage medium comprising the computer-executable program codes for:

generating a test signal for testing a device under test and outputting the test signal to each of a plurality of devices under test;

selecting an arbitrary device under test out of a plurality of the devices under test and controlling to put the selected device under test into a state that a measurement is ready to be started, and selecting a correction data corresponding to the selected device under test out of the correction data by each of a plurality of the devices under test, which are stored in a correction data storage means;

converting a measurement signal that the selected device under test outputs after performing a specific operation by the test signal into a measurement data that a storage means can store; and correcting a timing data to indicate a timing at which the measurement data is inputted to the storage means on the basis of the selected correction data, and instructing a timing at which the storage means stores an optimum measurement data representing a test result of the selected device under test.

6. Test equipment to test a plurality of devices under test in parallel, comprising:

a controller for outputting a control signal indicating which of the plurality of devices in parallel to test and outputting number data for the device being tested;

a first clock generator for receiving the control signal from the controller and outputting an enable signal to bring the device to be tested into an enabled state;

a pattern generator for outputting a pattern signal to each of the devices under test;

a judgment circuit receiving a measurement signal from the device under test, and converting the measurement signal to measurement data which is outputted;

a register circuit receiving the measured data from the judgment circuit;

a data generating circuit outputting a minimum value of timing for a clock signal;

a data correction circuit for receiving the number data from the controller and outputting a time correction value for the number data corresponding to the device under test;

an adding circuit for adding the minimum value from the data generating circuit and the time correction value from the data correction circuit to produce a timing signal; and a second clock generator receiving the timing signal from the adding circuit to output a second clock signal.

7. The test equipment of claim 6, wherein the second clock signal controls the register circuit to store the measurement data therein on the basis of the timing signal received from the adding circuit, the timing signal being such that the measurement data represents an optimum test result of the device under test.

8. The test equipment of claim 6, wherein the measurement signal comprises a voltage level from the device under test.

9. The test equipment of claim 8, wherein the measurement data comprises voltage level data.

10. The test equipment of claim 6, wherein the register circuit includes data storage means for storing the measurement data.

11. The test equipment of claim 6, wherein the judgment circuit receives the measurement signal when the device under test is short circuited.

12. The test equipment of claim 6, wherein the devices under test are integrated circuits.

13. The test equipment of claim 6, wherein the devices under test are tested in an arbitrary sequence.

14. The test equipment of claim 6, wherein the data correction circuit includes time correction values for each of the devices under test.

15. The test equipment of claim 14, wherein the time correction values compensate for differences in transmission time.

* * * * *